(12) United States Patent
Castillo et al.

(10) Patent No.: US 9,893,519 B1
(45) Date of Patent: Feb. 13, 2018

(54) SUBSTRATE PROVIDING ELECTRICAL COMMUNICATION BETWEEN POWER SOURCES

(75) Inventors: Aaron A. Castillo, Castaic, CA (US); Gabriel J. Perez, San Fernando, CA (US); David A. Tory, Simi Valley, CA (US); Alexandru Z. Pàl, Montrose, CA (US)

(73) Assignee: Quallion LLC, Sylmar, CA (US)

( * ) Notice: Subject to any disclaimer, the term of this patent is extended or adjusted under 35 U.S.C. 154(b) by 1637 days.

(21) Appl. No.: 13/385,108

(22) Filed: Feb. 1, 2012

Related U.S. Application Data (60) Provisional application No. 61/464,470, filed on Mar. 3, 2011.

(51) Int. Cl.
*H02J 1/00* (2006.01)

(52) U.S. Cl.
CPC ..................................... *H02J 1/00* (2013.01)

(58) Field of Classification Search
CPC ....................................................... H01M 2/24
See application file for complete search history.

(56) References Cited

U.S. PATENT DOCUMENTS

| | | | | |
|---|---|---|---|---|
| 4,099,816 A | * | 7/1978 | Bittner et al. | 439/525 |
| 7,479,346 B1 | * | 1/2009 | Chow | H01M 2/1083 320/112 |
| 7,807,285 B1 | * | 10/2010 | Berg et al. | 429/97 |
| 8,679,666 B1 | * | 3/2014 | Tsukamoto et al. | 429/99 |
| 2009/0152662 A1 | * | 6/2009 | Chen | H01L 27/14618 257/433 |
| 2010/0001690 A1 | * | 1/2010 | Tsuboi | 320/115 |

* cited by examiner

*Primary Examiner* — Thienvu Tran
*Assistant Examiner* — David M Stables
(74) *Attorney, Agent, or Firm* — Gavrilovich, Dodd & Lindsey, LLP (57) ABSTRACT

A substrate is physically attached to the terminals of multiple different power sources. The substrate includes multiple electrical conductors. Each of the electrical conductors is immobilized along its length relative to the substrate. The electrical conductors include interconnect lines and sensing lines. The interconnect lines provide electrical communication between the power sources. At least one of the sensing lines carries an electrical signal indicating a voltage across one or more of the power sources. Electronics that are immobilized on the substrate employ the electrical signal to determine the voltage across the one or more power sources.

20 Claims, 10 Drawing Sheets

SUBSTRATE PROVIDING ELECTRICAL COMMUNICATION BETWEEN POWER SOURCES

RELATED APPLICATIONS

This application claims the benefit of U.S. Provisional Patent Application Ser. No. 61/464,470, filed on Mar. 3, 2011, entitled "Power pack Employing Flexible Circuit Board," and incorporated herein in its entirety.

STATEMENT REGARDING FEDERALLY SPONSORED RESEARCH OR DEVELOPMENT

This invention was made with United States Government support under contract W15P7T-09-C-5645 awarded by the U.S. Army Communications-Electronic Research & Engineering Center (ACQ Center). The United States Government has certain rights in this invention.

FIELD

The present invention relates to power sources and more particularly to an interface between power sources and electronics.

BACKGROUND

As the interest in the use of batteries to power a variety of applications has increased, a variety of systems have been proposed that connect large numbers of electrochemical cells together. In order to reduce damage to the cells, it is often desirable to monitor the characteristics of individual cells or groups of cells. For instance, the voltage across the cells is often monitored is order to prevent over-charging and/or over-discharging of the cells. This monitoring is often achieved by connecting wires to the serial connections in the system. However, the number of interconnected electrochemical cells is being increased dramatically in response to the increased power demands of applications such as cars. The use of these wires in connection with systems that interconnect large numbers of electrochemical cells dramatically increases the size, weight, complexity, and maintenance challenges of the system. Further, as the number of electrochemical cells increases, the wires become a source of failure in the system. As a result, there is a need for an improved system having multiple interconnected electrochemical cells.

SUMMARY

A substrate is physically attached to the terminals of multiple different power sources. The substrate includes multiple electrical conductors. Each of the electrical conductors is immobilized along its length relative to the substrate. The electrical conductors include interconnect lines. The interconnect lines provide electrical communication between the power sources.

In some instances, the electrical conductors include sensing lines. At least one of the sensing lines carries an electrical signal indicating a voltage across one or more of the power sources. Electronics immobilized on the substrate employ the electrical signal to determine the voltage across the one or more power sources.

DESCRIPTION

The system includes a flexible circuit board connected to power sources. The flexible circuit board includes the electrical lines for one or more different circuits immobilized on a substrate. In some instances, the electrical lines include lines such as power lines, sensing lines, control lines, data lines, interconnects, and other circuit lines. Interconnects provide series and/or parallel connections between the power sources. Sensing lines allow electronics to monitor the performance and/or characteristics of the power sources during the charging and/or discharging of the power sources. Data lines carry light signals that carry data for or about the operation of the power sources. Power lines are the lines that are used to access the power from the power sources. Control lines connect components that affect the characteristics of the power that is available from the power lines. The accessed power can then be used to power applications such as military, automotive, industrial, aeronautical, and biomedical fields. Particular example applications include, but are not limited to, radio transmissions and night vision devices. By placing the power lines, sensing lines, and interconnects on a single flexible circuit board, the size, weight, and complexity of the system is reduced.

In some instances, the flexible circuit board is bent around the power sources and a first portion of the flexible circuit is connected to terminals on one side of the power sources while another portion of the flexible circuit board is connected to other terminals on the opposing sides of the power sources. Since a single flexible circuit board can be connected to terminals on opposing sides of the power sources, the system is further simplified by reducing the number of parts and connections in the system.

Figure 1A:
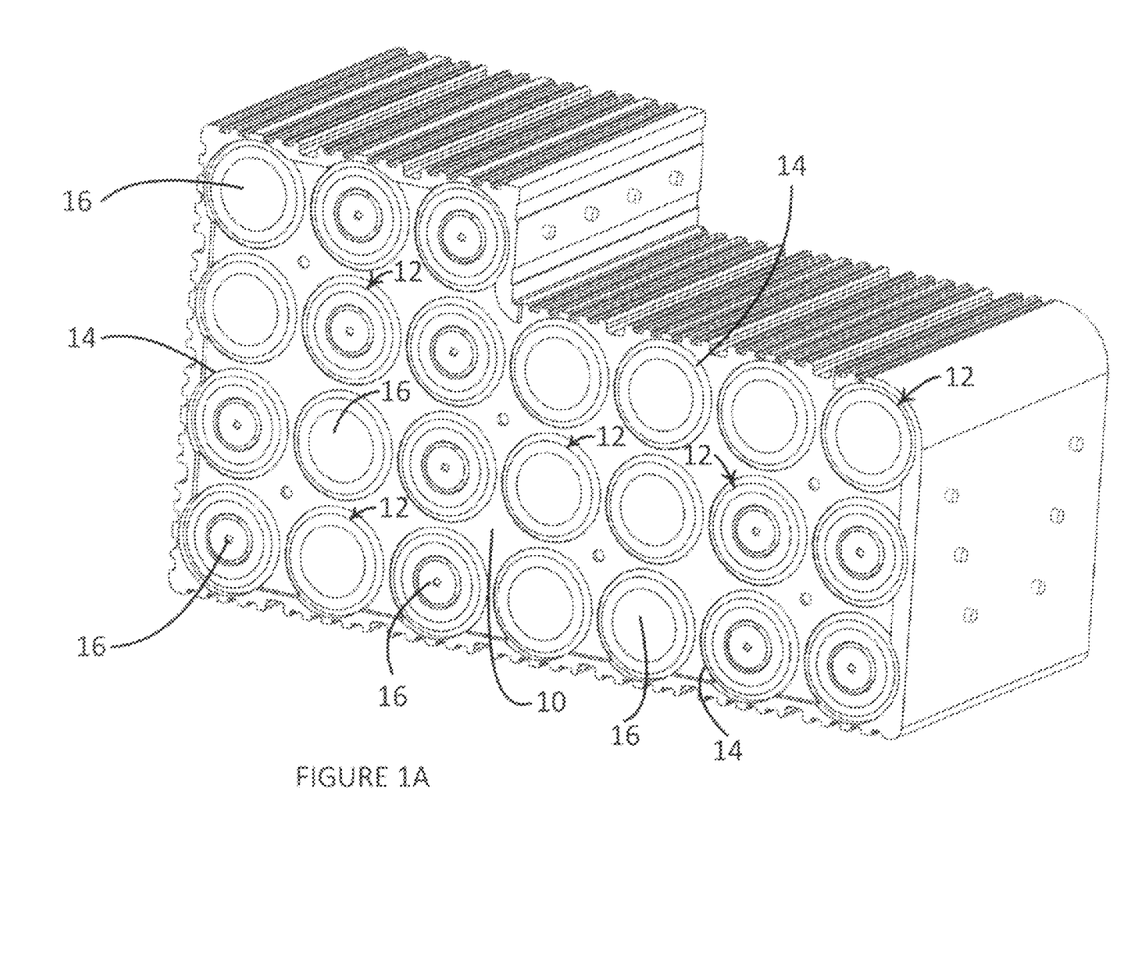
FIG. 1A is a perspective view of a portion of the power system having power sources located in a holder.

FIG. 1A is a perspective view of a portion of the power system. The system includes a holder 10 that holds multiple electrical power sources 12. The holder 10 includes openings 14 that are each sized to receive one of the electrical power sources 12. The electrical power sources 12 each have two terminals 16 positioned on opposing sides of the electrical power source 12. For instance, the illustrated electrical power sources 12 are cylindrical and each has a terminal 16 on opposing ends of the cylinder. Although not evident from FIG. 1A, the holder 10 is configured such that the terminal 16 on the top of each electrical power source 12 can be accessed from above the holder 10 and the terminal 16 on the bottom of the electrical power source 12 can be accessed from under the holder 10.

The electrical power sources 12 are electrical power sources 12 configured to store and discharge electrical energy. For instance, the electrical power sources 12 can each be an electrochemical cell or group of electrochemical cells, a battery or batteries, capacitor, solar cell, solar panel, or piezoelectric transducer. In some instances, each of the power sources is an electrochemical cell or a battery. An example of a suitable electrical power source 12 for use with the holder 10 is the BR-AAK CFx Cell from Panasonic, Inc. and AA cells available from commercial vendors. Although the electrical power sources 12 shown in FIG. 1A are cylindrical, other electrical power source 12 configurations are possible.

The holder 10 can be configured to act as a heat sink that provides cooling of the electrical power sources 12. Accordingly, the holder 10 can be configured such that the holder 10 surrounds and contacts each of the electrical power sources 12. Additionally, the holder 10 can be constructed of a material that conducts heat. Suitable materials for the holder 10 include, but are not limited to, a plastic such as Acrylonitrile Butadiene Styrene (ABS) and High Density Polyethylene Plastic (HDPE), and metals such as aluminum.

Figure 1B:
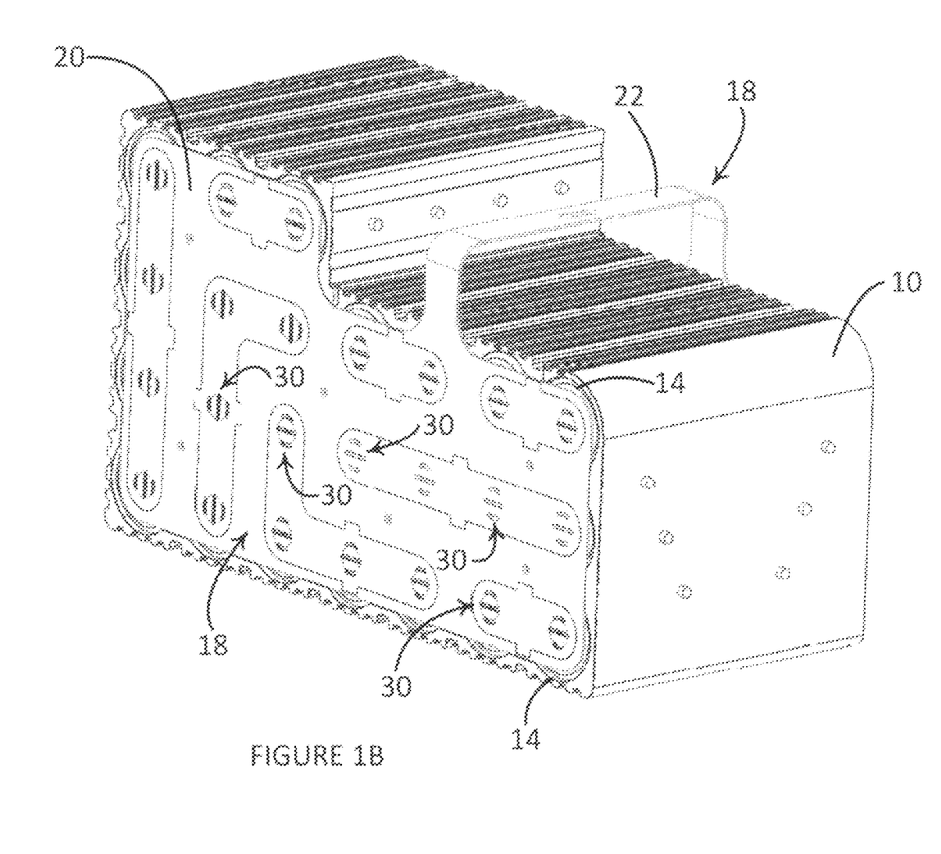
FIG. 1B illustrates a flexible circuit board attached to the power sources of FIG. 1A.

FIG. 1B is a perspective view of the power system. The system includes a flexible circuit board attached to the electrical power sources 12 located in the holder 10 of FIG. 1A as shown in FIG. 1B. The flexible circuit board of FIG. 1B includes a first section 20 positioned over a top of the electrical power sources 12, a second section positioned under the electrical power sources 12 (not visible in FIG. 1B) and a bridge section 22 connecting the first section and the second section. The flexible circuit board 18 includes conductors mounted on a flexible substrate. The conductors are commonly metal traces on the substrate but can be other conductors such as copper strips laminated onto the substrate. While the substrate can be a single layer of material, the substrate generally includes multiple layers. In order to provide flexibility to the substrate, the substrate is generally constructed of flexible layers of plastic substrates, such as polyimide, PEEK, poklywester, transparent conductive Polyester film, and poly(ethylene terephthalate). Another suitable substrate material includes, but is not limited to, poly(4,4'-oxydiphenylene-pyromellitimide) also commercially available under the tradename KAPTON®.

Although not evident in FIG. 1B, a portion of the conductors on the substrate are interconnects that provide serial and/or parallel connections between the electrical power sources 12. The interconnects include connection points 30 where the flexible circuit board 18 is connected to the electrical power sources 12. For instance, the connection points 30 can each be directly connected to a terminal 16 on one of the electrical power sources 12. In one example, the connection points 30 are each directly welded to one of the terminals 16. As a result, in some instances, different portions of the substrate are each immobilized relative to a power source or a terminal of a power source. Further, the flexible nature of the substrate allows the flexible circuit board 18 to be bent around the electrical power sources 12 and/or the case. As a result, the connections points on the first section of the flexible circuit board 18 can be connected to terminals 16 on the top of the electrical power sources 12 and the connections points on the second section of the flexible circuit board 18 can be connected to terminals 16 on the bottom of the electrical power sources 12.

The flexible circuit board 18 includes a first electrical connector 24 configured to be coupled with a second electrical connector. As will be discussed in more detail below, the first electrical connector 24 includes pins that are each in electrical communication with one or more of the conductors on the flexible circuit board 18. Although FIG. 1B shows the first electrical connector 24 positioned on the bridge portion of the flexible circuit board 18 shown in FIG. 1B, the first electrical connector 24 can be positioned elsewhere on the flexible circuit board 18.

Figure 2:
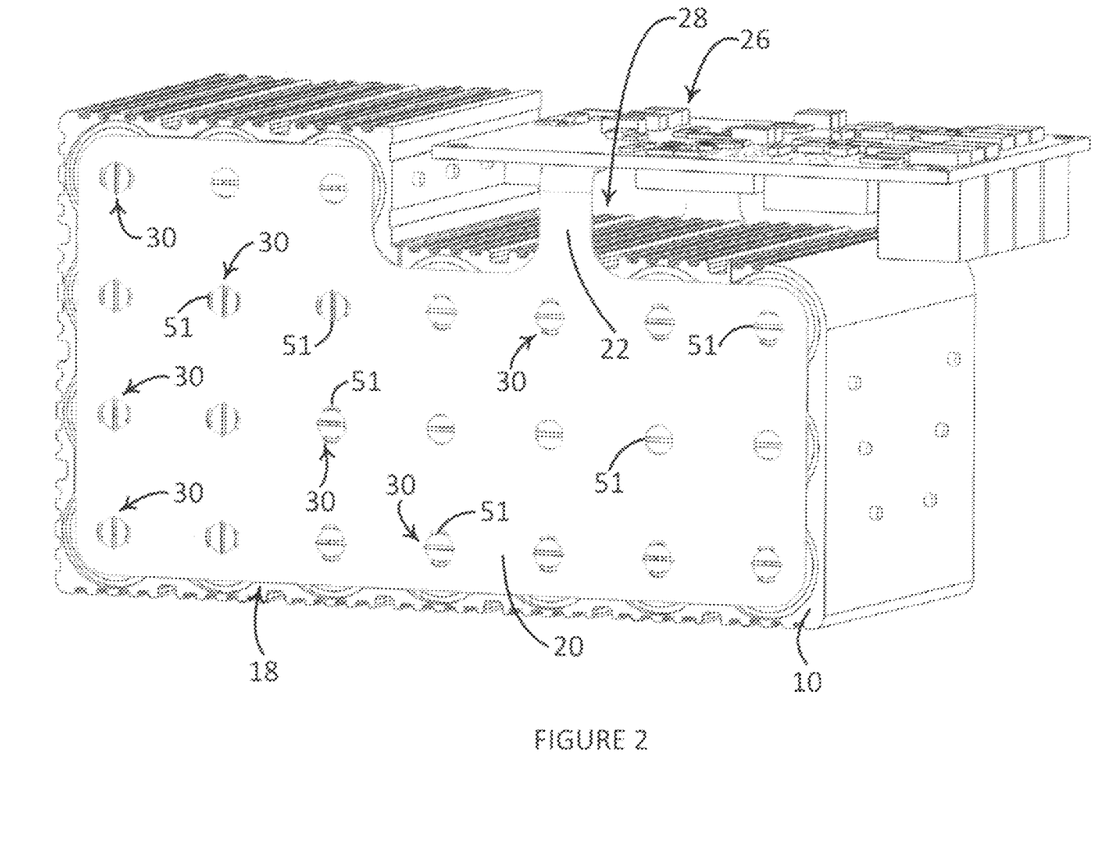
FIG. 2 illustrates a printed circuit board electrically coupled with the flexible circuit board of FIG. 1B.

The first electrical connector 24 can be used to provide electrical communication between the flexible circuit board 18 and other electronics. For instance, FIG. 2 illustrates a printed circuit board 26 attached to the flexible circuit board 18. The printed circuit board 26 includes a second electrical connector (not shown) that is connected directly to the first electrical connector 24 or mated with the first electrical connector 24. As a result, the electronics on the printed circuit board 26 can be in electrical communication with the conductors on the flexible circuit board 18. As will become discussed in more detail below, the electronics can monitor the charge and/or discharge of the electrical power sources 12.

The printed circuit board 26 can be a traditional printed circuit board having a rigid structure. In some instances, the printed circuit board 26 has a dielectric layer between a trace layer and a ground layer. Although FIG. 2 shows the electronics mounted on the printed circuit board 26, in some instances, the electronics are incorporated directly onto the flexible circuit board 18.

The holder 10 has a recess or stepped down area 28 in which the printed circuit board 26 is positioned. The location of the printed circuit board 26 in the stepped down area provides the system with an approximately rectangular configuration. As a result, the system can be located in a substantially rectangular space or case.

Figure 3:
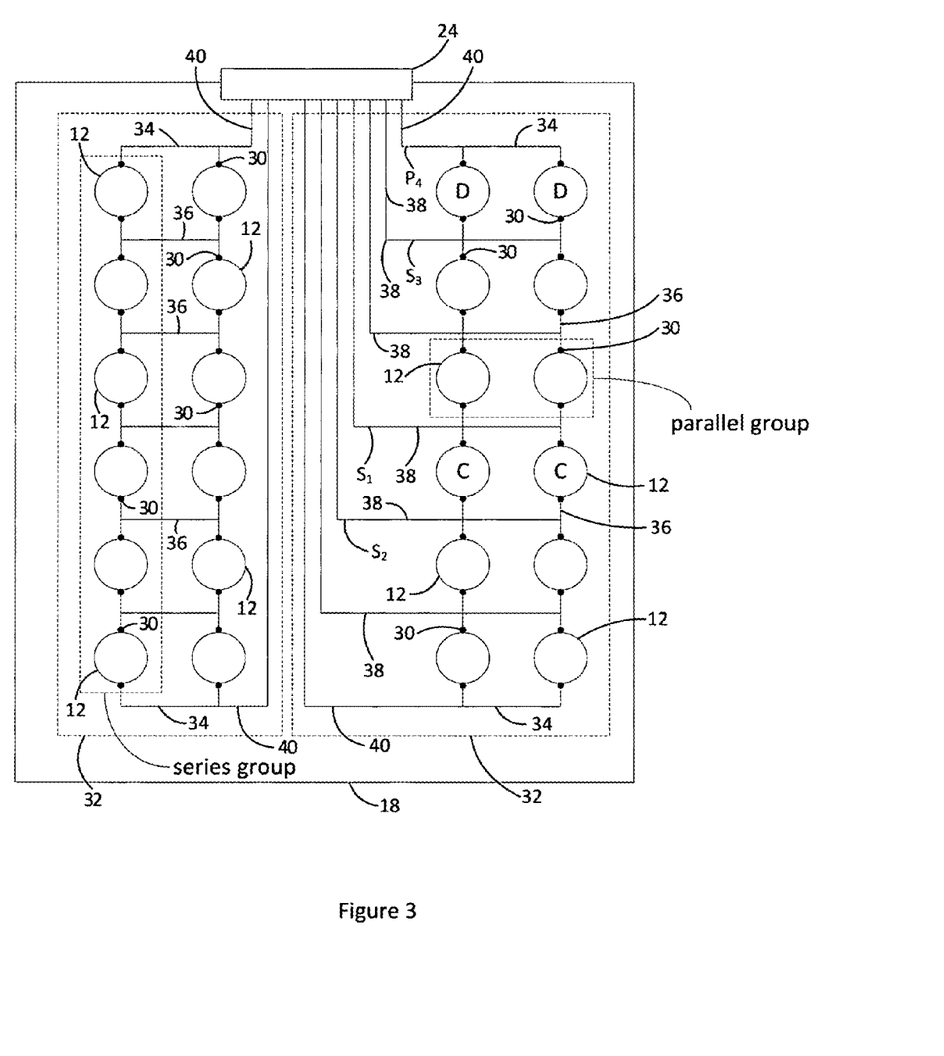
FIG. 3 shows a schematic for the connections provided by the flexible circuit board of FIG. 1B and FIG. 2.

FIG. 3 shows a schematic for the connections provided by the flexible circuit board 18 of FIG. 1B and FIG. 2. Although the electrical power sources 12 are not part of the flexible circuit board 18, the electrical power sources 12 are shown in FIG. 3 in order to show the connections between the electrical power sources 12 as are provided by the circuit board. The flexible circuit board 18 includes multiple connection points 30. Conductors on the flexible circuit board 18 are connected to the terminals 16 of the electrical power sources 12 at these locations. In some instances, the conductors on the flexible circuit board 18 are welded to the terminals 16 at these locations.

The system of FIG. 3 includes two power packs 32. Each power pack 32 includes six parallel groups and two series groups. Each parallel group includes electrical power sources 12 connected in parallel. Each series group connects one of the electrical power sources 12 in each parallel group in series and none of the electrical power sources 12 belongs to more than one series group.

The flexible circuit board 18 includes interconnects that provide electrical communication between different electrical power sources 12. As will be discussed below, the interconnects can be directly connected to the electrical power sources 12. As a result, the interconnects can provide direct electrical communication between different electrical power sources 12 in that the interconnects are the only electrical conductor between the terminals 16 of different electrical power sources 12.

The interconnects can include parallel interconnects 34 that provide electrical connections between the same terminal 16 of different electrical power sources 12. For instance, a positive parallel interconnect 34 can provide electrical communication between the positive terminals 16 of different electrical power sources 12. The interconnects also include parallel/series interconnects 36 that provide electrical connections between the same terminal 16 of different electrical power sources 12 and also provide electrical connections between the different terminals 16 from different electrical power sources 12. For instance, a parallel/ series interconnect 36 can connect the positive terminal 16 of one electrical power source 12 to the positive terminal 16 from one or more other electrical power sources 12 and also connect that positive terminal 16 to the negative terminals 16 from one or more other electrical power sources 12.

Although not shown in FIG. 3, the interconnects can also include series interconnects that provide electrical connections between different terminals 16 of different electrical power sources 12. For instance, if the system included electrical power sources 12 that are connected in series but without either of those electrical power sources 12 being connected in parallel with another electrical power source 12, a series interconnect can be employed to provide the series connection between the electrical power sources 12. In this instance, the series interconnect would connect the positive terminal 16 of one electrical power source 12 with the negative terminal 16 of another electrical power source 12.

The conductors on the substrate can also include sensing lines 38 and power lines 40 that each provides electrical communication between the electrical power sources 12 and the first electrical connector 24. Each power line 40 and each sensing line 38 can be connected to one or more pins in the first electrical connector 24. The power lines 40 are the lines that the electronics employ to extract power from the power packs included in the system. For instance, in FIG. 3, the power lines 40 provide electrical communication between the parallel interconnects 34 and the first electrical connector 24. As a result, the electronics can use the power lines 40 connected to the same power pack to access the power of the entire power pack. The electronics can then employ the accessed power to power applications such as radio transmissions and night vision devices. Accordingly, the electronics can apply this power to terminals that can be accessed from outside of the system. A user of the system can connect the application to those terminals to access the power provided by the electronics.

The sensing lines 38 are the lines that the electronics use to monitor the electrical power sources 12 in the power packs. For instance, the electronics can monitor the sensing lines 38 labeled S1 and S2 to determine the voltage of the electrical power sources 12 labeled "C" in FIG. 3. In some instances, the electronics can employ a power line 40 as a sensing line 38. For instance, the electronics can monitor the sensing line 38 labeled S3 and the power line 40 labeled P4 to determine the voltage of the electrical power sources 12 labeled "D" in FIG. 3.

The electronics can use the voltage monitored for different electrical power sources 12 for a variety of different purposes. For instance, the electronics can stop charging the electrical power sources 12 in the system when it determines that the voltage of one or more electrical power sources 12 exceeds an upper threshold. Additionally or alternately, the electronics can stop discharging the electrical power sources 12 in the system when it determines that the voltage of one or more electrical power sources 12 falls below a lower threshold.

The conductors on the substrate can also include one or more sensing lines that provide electrical communication between a sensor and the first electrical connector 24. Examples of suitable sensors include, but are not limited to, temperature sensors, pressure sensors, vibration sensors, and moisture sensors. The sensors can be connected directly to the substrate and/or one or more electrical conductor such as a wire can provide electrical communication between a contact pad on the substrate and also to the sensors. Accordingly, the electronics control the charge and/or discharge of a power pack in response to output from the one or more sensors. For instance, the electronics can stop charging the electrical power sources 12 in the system when it determines that the temperature of one or more electrical power sources 12 exceeds an upper threshold.

Additional or alternate functions of the electronics and examples of circuitry that can be included in the electronics are disclosed in U.S. patent application Ser. No. 11/404,211, filed on Apr. 13, 2006, and entitled "Power pack System," and U.S. patent application Ser. No. 11/985,391, filed on Nov. 15, 2007, and entitled "Power Pack," and U.S. patent application Ser. No. 12/587,778, filed on Oct. 13, 2009, and entitled "Balancing of Cells in Cell System," and in U.S. patent application Ser. No. 12/462,070, filed on Jul. 28, 2009, and entitled "Battery System Configured To Survive Failure of One or More Batteries," and in U.S. patent application Ser. No. 11/824,816, filed on Jul. 3, 2007, entitled "Power pack System" and issued as U.S. Pat. No. 7,843,169 on Nov. 30, 2010, and in U.S. patent application Ser. No. 11/603,757, filed on Nov. 22, 2006, and entitled "System Having Electronics for Dropping Current of Power pack, each of which is incorporated herein in its entirety. The various components that are disclosed in these applications in addition to the power sources, and power source interconnects can be included in the electronics disclosed above. For instance, the electronics, shunt circuits and/or controller disclosed in U.S. patent application Ser. No. 11/404,211 can be included in the electronics. As another example, the electronics, shunt circuits, balancing circuit, and sensors disclosed in U.S. patent application Ser. No. 11/985,391 can be included in the electronics. As another example, the controller electronics, and/or balancing terminals from U.S. patent application Ser. No. 12/587,778 can be included in the electronics. Further, the electronics can provide the functionality described in these applications. For instance, the electronics can operate the power packs so the power packs will stay operational despite the failure of one or more power sources as described in U.S. patent application Ser. No. 12/462,070 or can operate the power packs as described in U.S. patent application Ser. No. 11/824,816 and/or in U.S. patent application Ser. No. 11/603,757.

In some instances, the electronics employ one or more of the sensing lines 38 as a power line 40. For instance, it may be desirable to power an application using a voltage that is less than the total voltage of the power pack. As a result, the electronics can use the sensing lines 38 access electrical power from across a smaller number of electrical power sources 12. For instance, the electronics can use the power line 40 labeled S4 and the sensing line 38 labeled S1 to access power having a voltage equal to three of the electrical power sources 12 connected in series. The electronics can then employ this power to power an application for which this voltage is suitable.

FIG. 4A through FIG. 4D illustrate an example of a flexible circuit board 18 construction suitable for creating a system with the schematic of FIG. 3. The flexible circuit board 18 is constructed of multiple layers that are stacked together and immobilized relative to one another to form the final flexible circuit board 18.

Figure 4A:
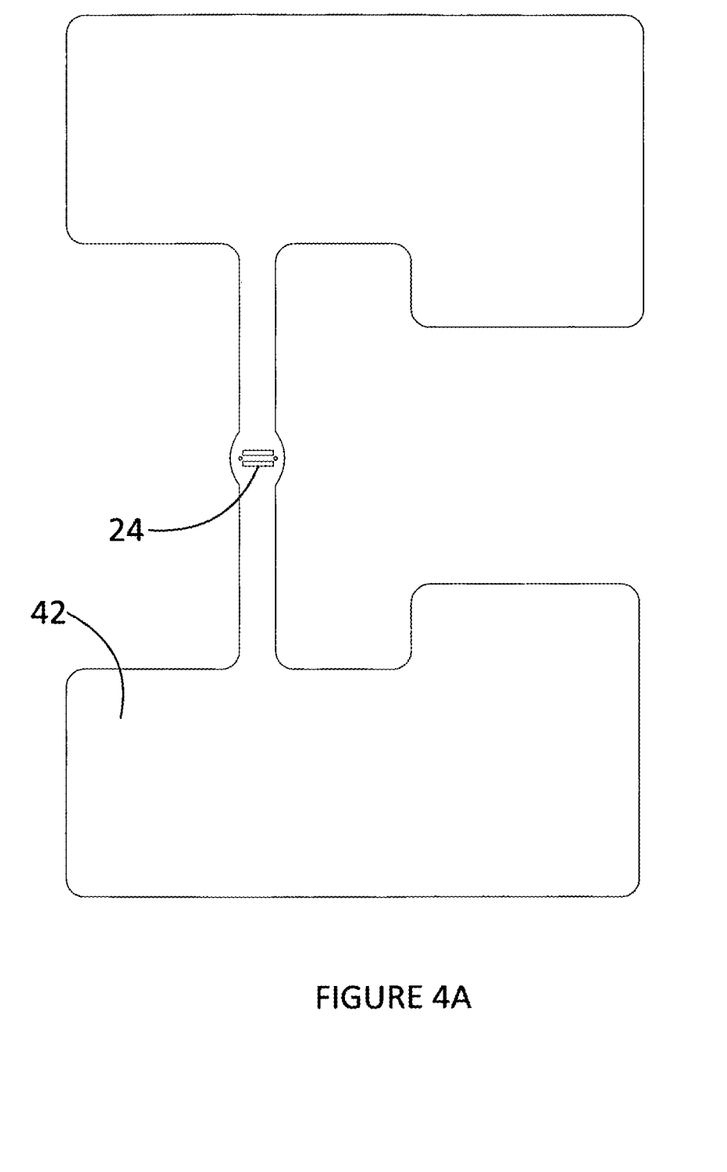
FIG. 4A through FIG. 4D illustrate an example of a flexible circuit board construction suitable for creating a system with the schematic of FIG. 3.

FIG. 4A is a topview of an upper layer. This layer includes the first electrical connector 24 bonded to an upper layer substrate. In one example, the upper layer substrate is a layer of poly(4,4'-oxydiphenylene-pyromellitimide, commercially available under the tradename KAPTON®).

Figure 4B:
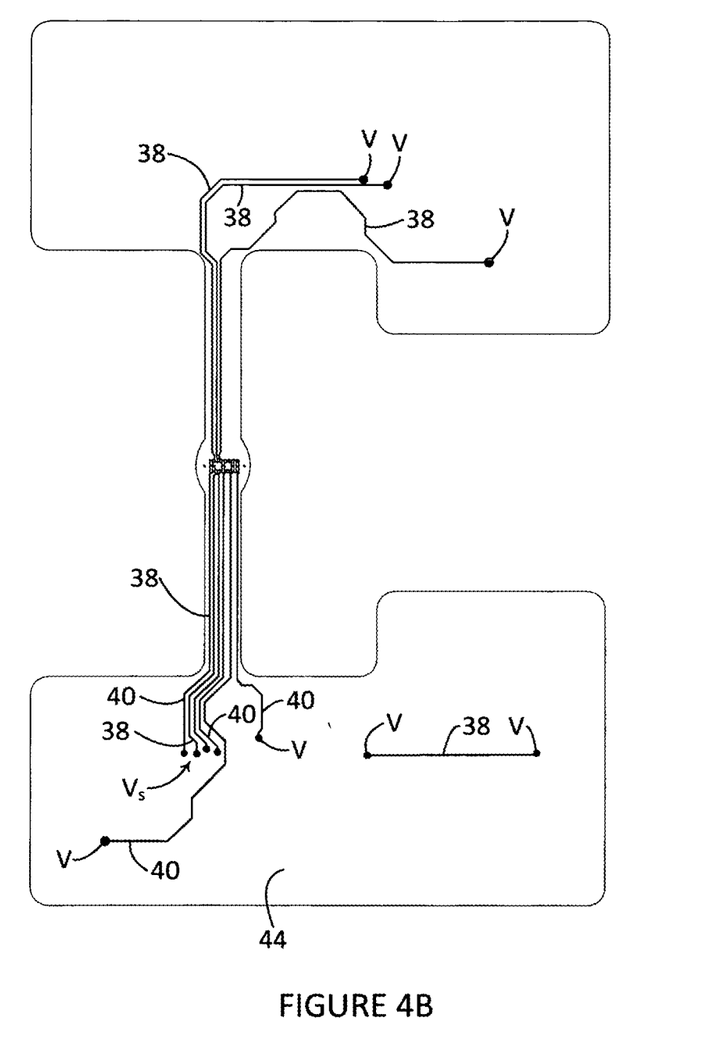

FIG. 4B is a topview of a line layer. The line layer includes a portion of the power lines 40 and the sensing lines 38 on a line layer substrate 44. In one example, the substrate for the line layer is a layer of poly(4,4'-oxydiphenylene-pyromellitimide) commercially available under the tradename KAPTON®.

The sensing lines 38 and the power lines 40 terminate at a location that is aligned with the first electrical connector 24 on the upper layer. The different layers of the flexible circuit board 18 are assembled so to provide electrical communication between the pins in the first electrical connector 24 and the sensing lines 38 and power lines 40. Each pin can be in electrical communication with one or more lines selected from the group consisting of sensing lines 38 and power lines 40.

Figure 4C:
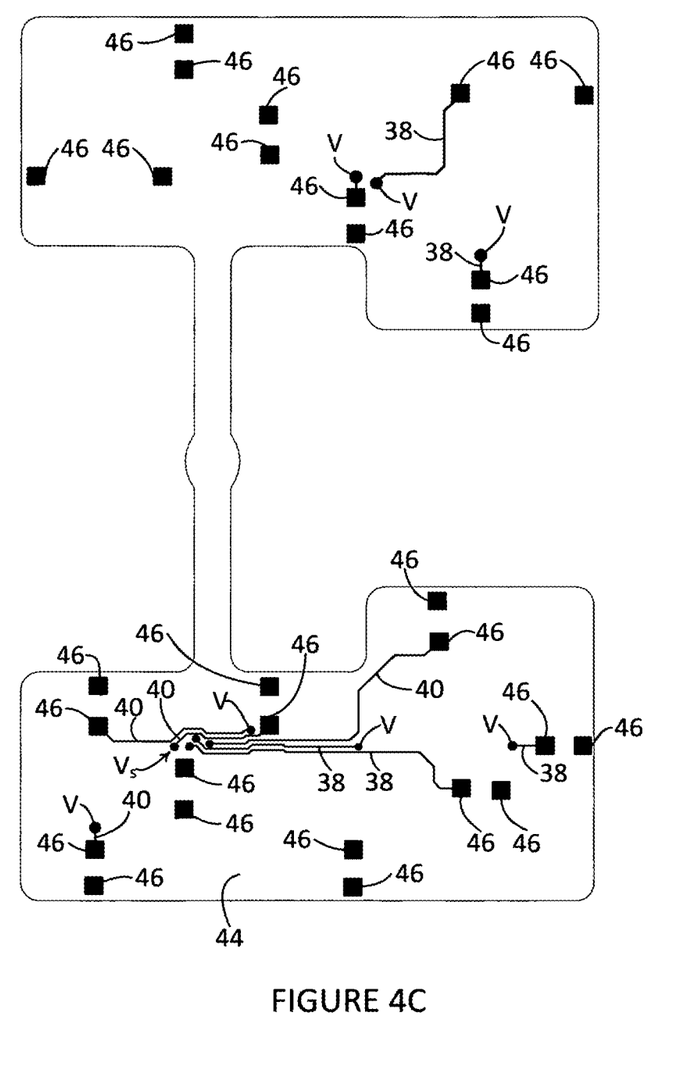

FIG. 4C shows the components on the bottom of the line layer. Rather than flipping the flexible circuit board 18 and showing a bottom view in FIG. 4C, FIG. 4C is a mirror image of the bottom view. Another way of looking at FIG. 4C is a topview of the line layer but with the components of FIG. 4B being invisible and the substrate being transparent. As a result, the location of the components on FIG. 4C can be easily compared with the other images in FIG. 4A through FIG. 4D.

As is evident from FIG. 4C, the bottom side of the line layer also includes a portion of the sensing lines 38 and power lines 40. Some of the sensing lines 38 and power lines 40 pass through vias in the substrate and as a result are preset on both the top and bottom of the substrate of the line layer. The locations of the portion of the vias is labeled "V" in FIG. 4C. Due to the close proximity between many of the vias, labeling all of the vias confuses the image. As a result, tight grouping of vias are labeled "Vs." A sensing lines 38 or power lines 40 that terminates at a via in FIG. 4C continues at the corresponding location in FIG. 4B.

The line layer includes multiple pads 46 on the substrate. Suitable pads 46 are layers of electrically conducting materials. Suitable pads 46 include, but are not limited to, metal traces on the substrate and metal strips laminated onto the substrate. Examples of suitable materials for the pads 46 include, but are not limited to, metals such as Nickel, Copper, and Tin. Suitable sensing lines 38 and power lines 40 include, but are not limited to, metal traces on the substrate and metal strips laminated onto the substrate. Examples of suitable materials for the sensing lines 38 and power lines 40 include, but are not limited to, metals such as Nickel, Copper, and Tin. Each of the power lines 40 and sensing lines 38 is in electrical communication with one of the pads 46. Accordingly, upon final assembly of the flexible circuit board 18, each of the power lines 40 and sensing lines 38 provides electrical communication between one of the pads 46 and a pin in the first electrical connector 24.

Figure 4D:
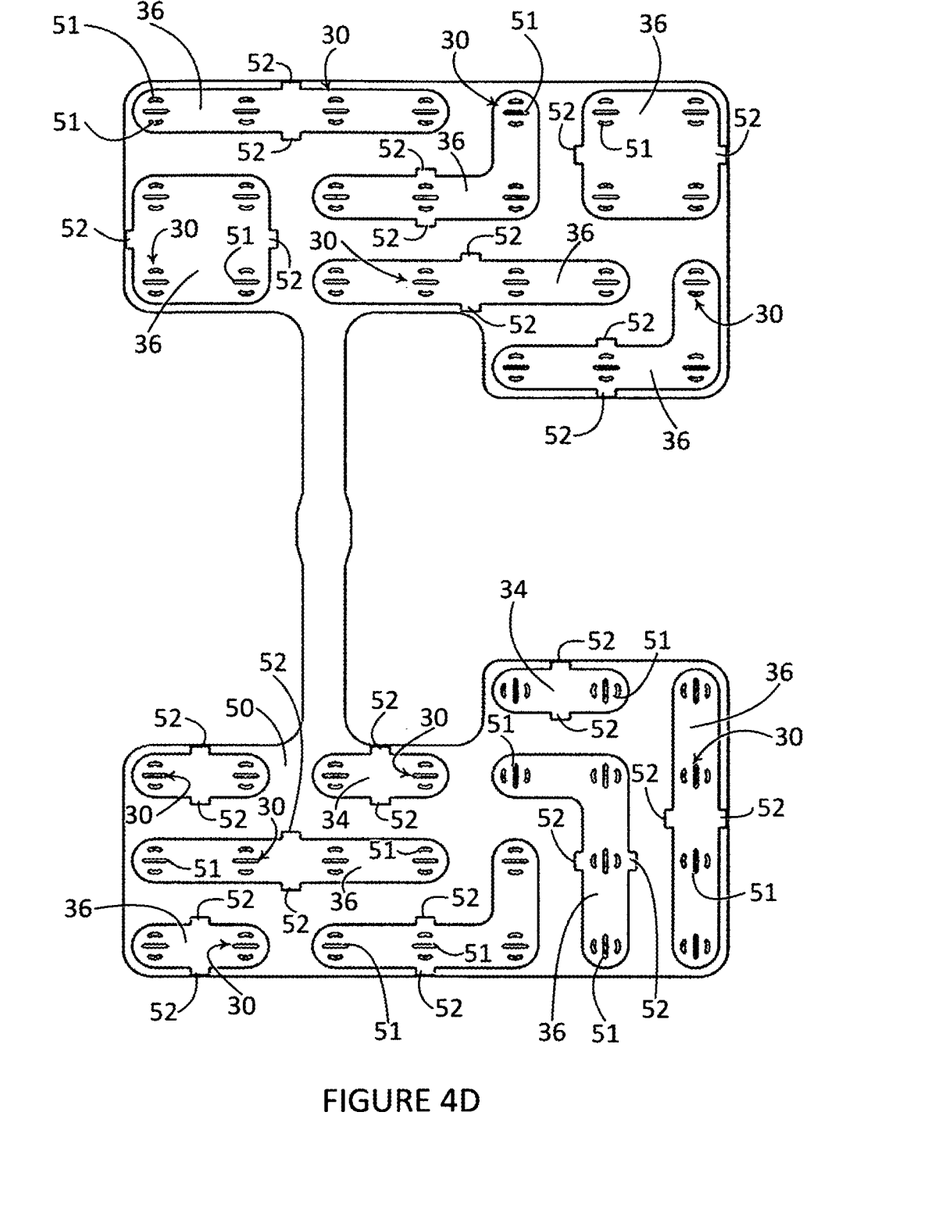

FIG. 4D shows the bottom layer of the flexible circuit board 18. The bottom layer includes components on a bottom layer substrate 50. FIG. 4D is as a topview of the bottom layer.

The bottom layer includes the interconnects on a substrate. For instance, the bottom layer includes the parallel interconnects 34 and the parallel/series interconnects 36 shown in FIG. 3. Suitable interconnects include, but are not limited to, metal traces on the substrate and metal strips laminated onto the substrate. Suitable materials for the interconnects include, but are not limited to, Nickel, Copper, and Brass. As a result, the power lines 40, sensing lines 38, and the interconnects are included on a single flexible circuit board 18.

Each of the interconnects shown in FIG. 4D includes connection points 30. The connection points 30 are where the flexible circuit board 18 can be directly connected to the electrical power sources 12. For instance, each of the connection points 30 can be welded directly to a terminal 16 of one of the electrical power sources 12. As a result, upon assembly of the system as shown in FIG. 1A through FIG. 2, each of the connection points 30 is in electrical communication with one of the electrical power sources 12. Further, since each interconnect includes multiple connection points 30, each interconnect is in electrical communication with multiple electrical power sources 12.

Although not shown in FIG. 4A through FIG. 4C, the layers of the flexible circuit board include openings aligned with the connection points so that each of the connection points 30 shown in FIG. 4D is accessible both from above and below the flexible circuit board. As a result, FIG. 1B and FIG. 2 both show the connection points 30 as being accessible from outside of the system. Further, FIG. 1B and FIG. 2 each uses dashed lines to illustrate the locations of the interconnects and accordingly shows the locations of the connection points 30 relative to the interconnects.

The connection points 30 each includes one or more openings 51 that extend through the interconnect. Since the connection points are accessible from above and below the flexible circuit board, the openings 51 in interconnects effectively extend through the flexible circuit board. These openings allow the flexible circuit board to be easily connected to the terminals. For instance, the flexible circuit board can be placed over the terminals. Since the connection points are accessible from both sides of the flexible circuit board, this placement brings the connection points into contact with the terminals. Since the connection points are still accessible from above the flexible circuit board, the connection points can then be welded to the terminals through the openings in the connection points 30. During this operation, the flexible circuit board aligns the connection points and the terminals.

The above configuration adds flexibility to the construction of the flexible circuit board. For instance, since the connection points are accessible from the both sides of the flexible circuit board, either side of the flexible circuit board can be connected to the terminals by re-locating the first electrical connector to the other side of the flexible circuit board. As a result, the first electrical connector can be moved to other locations and/or other layers of the flexible circuit board.

Each of the interconnects shown in FIG. 4D includes tabs 52 extending from a side of the interconnect. A comparison of FIG. 4D with FIG. 4C shows that each of these tabs 52 aligns with one of the pads 46 shown in FIG. 4C upon final assembly of the flexible circuit board 18. The flexible circuit board 18 is assembled such that each of these tabs is in electrical communication with the aligned pad 46. Accordingly, the tabs provide electrical communication between the interconnect and the associated sensing line 38 or power line 40. Further, since each of the sensing lines 38 and power lines 40 are each in electrical communication with the first electrical connector 24, the tabs provide electrical communication between the each of interconnects and the first electrical connector 24.

Figure 4E:
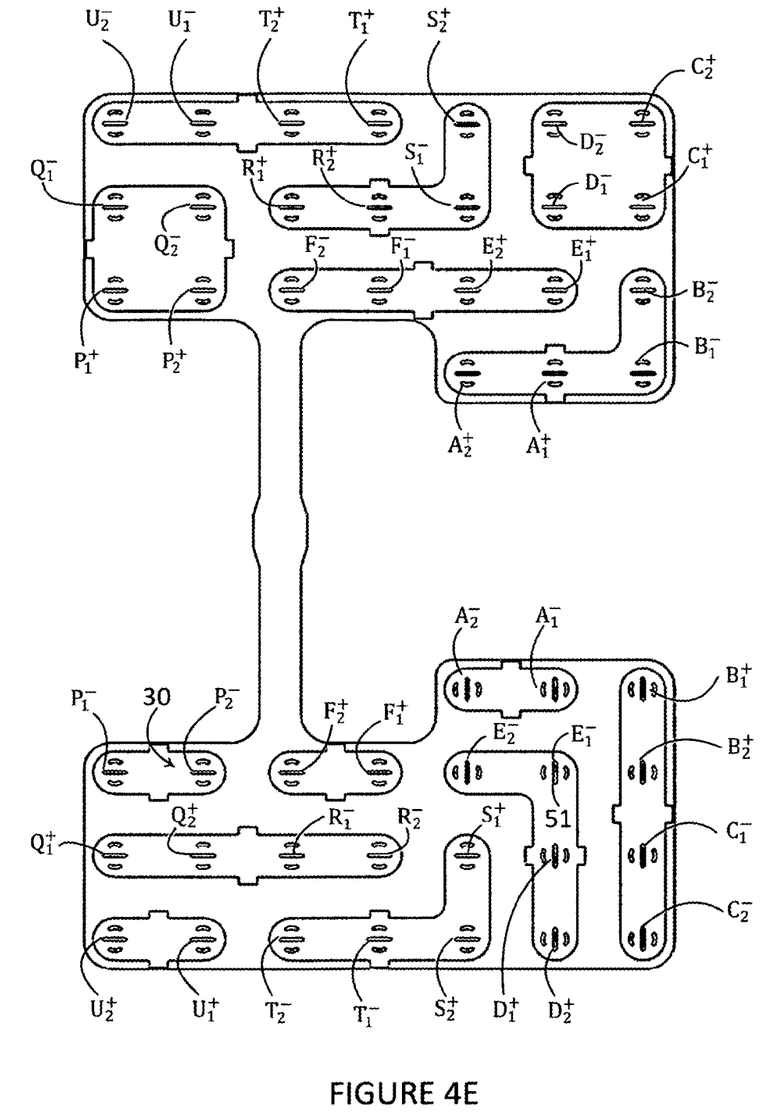
FIG. 4E identifies the power sources that are connected to different connection points on the flexible circuit board in order to achieve the schematic of FIG. 3.

FIG. 4E illustrates the connections between the connection points 30 and the electrical power sources 12 so as to achieve the schematic of FIG. 3. For instance, FIG. 4E is a copy of FIG. 4D but with each of the connection points 30 labeled $X_i^j$; where $X_i$ represents a particular electrical power source 12 and j represents the terminal 16 of electrical power source 12 $X_i$ to which that connection point 30 is connected. For instance, when j is positive, the connection point 30 labeled $X_i^+$ is connected to the positive terminal 16 of electrical power source 12 $X_i$. Further, electrical power sources 12 having the same letter for "X" are connected in parallel. As is evident from FIG. 1A, the electrical power sources 12 can be positioned in the holder 10 in different orientations. For instance, each electrical power source 12 can be positioned in the holder 10 with their positive terminal 16 up or down. Accordingly, the electrical power sources 12 are positioned in the holder 10 in the orientation that allows the connection points 30 to be connected to the correct terminal 16.

In addition to the layers shown in FIG. 4A through FIG. 4E, the flexible circuit board 18 can optionally include other layers as is know in flexible circuit board 18 construction. In some instances, the flexible circuit board 18 excludes the ground layer associated with traditional printed circuit board 26 constructions. For instance, one or more additional substrate layers can be added above, below, and/or between the above layers. In these instances, the additional substrate layers include openings that provide access to the connection points as described above.

Figure 5:
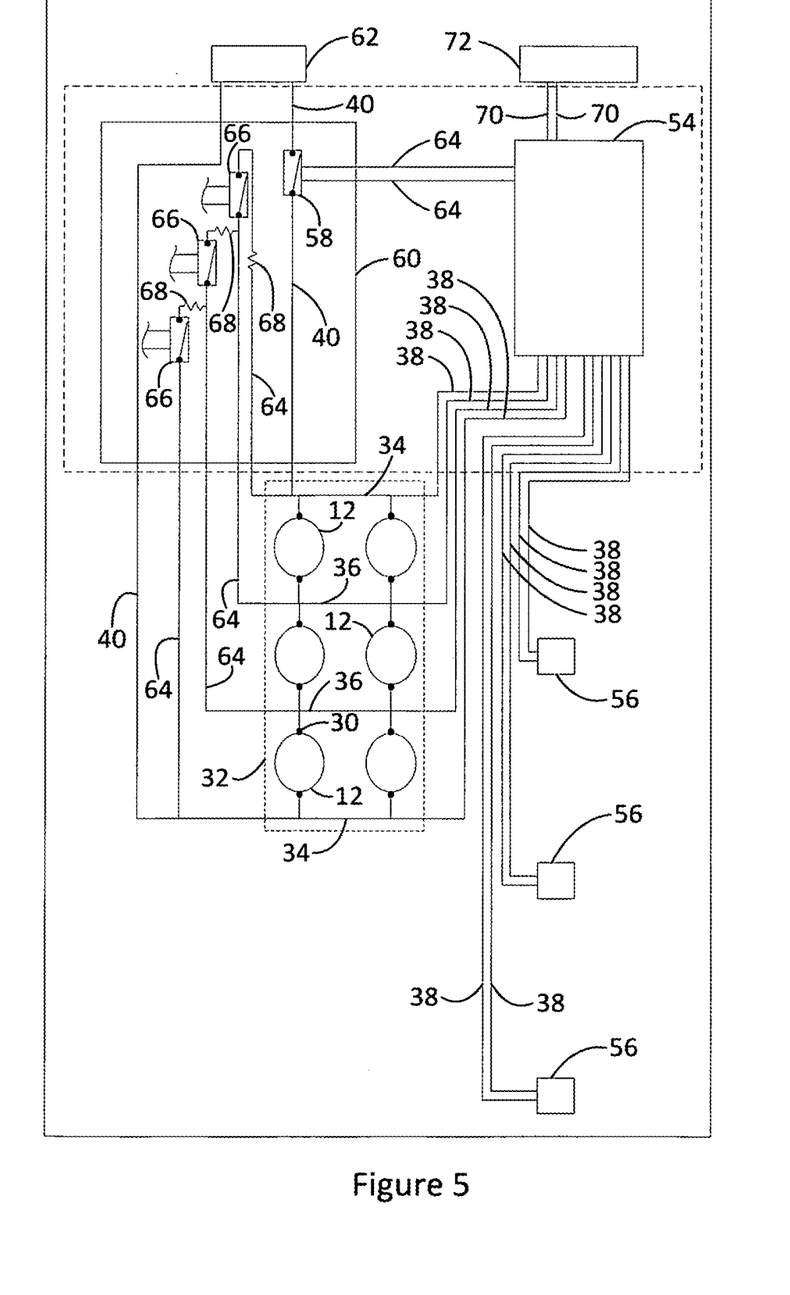
FIG. 5 is a schematic for a flexible circuit board having electronics from a power system such as the power system of FIG. 3 incorporated into a flexible circuit board.

As noted above, all or a portion of the electronics that are located on the printed circuit board 26 can be located on the flexible circuit board 18. FIG. 5 shows a schematic for the connections for a flexible circuit board having the electronics incorporated into the flexible circuit board. In order to simplify the illustration, the system is shown with a single power pack 32 that includes three parallel groups and two series groups. As a result, the flexible circuit board includes connection points 30, the power lines 40, and the interconnects (parallel interconnect 34 or a parallel/series interconnects 36) discussed above.

The electronics include a controller 54. The controller 54 can operate using firmware, hardware, software or a combination thereof. Examples of suitable controllers 54 include, but are not limited to, analog electrical circuits, digital electrical circuits, processors, microprocessors, digital signal processors (DSPs), computers, microcomputers, ASICs, and discrete electrical components, or combinations suitable for performing the required control functions. In some instances, the controller 54 includes one or more memories and one or more processing units such as a CPU. The one or more memories can include instructions to be executed by the controller 54 during operation of the system.

A portion of the conductors on the substrate serve as sensing lines 38 that are in electrical communication with the controller 54. A portion of the sensing lines 38 are each connected to a parallel interconnect 34 or a parallel/series interconnects 36. The controller 54 can use these sensing lines 38 to monitor the voltage of different parallel groups for a variety of different purposes.

The flexible circuit also includes one or more sensors 56 and one or more sensing lines 38 that are each connected to a sensor 56. The sensors 56 can be configured to measure characteristics such as temperature, pressure, vibration, and moisture. Examples of suitable temperature sensors include, but are not limited to, thermocouples, thermistors, RTD's, and diodes. Examples of suitable pressure sensors include, but are not limited to, strain gages, and load cells. Examples of suitable vibration sensors include, but are not limited to, accelerometers, and piezoelectrics. Examples of suitable moisture sensors include, but are not limited to, capacitive and resistive sensors.

More than one of the sensors 56 on a flexible circuit board can be configured to measure the same characteristic. For instance, a flexible circuit board can include more than one temperature sensor and/or more than one pressure sensor. Accordingly, a portion of the sensors 56 on a flexible circuit board can be configured to measure the same characteristic while one or more other sensors are configured to measure a different characteristic.

The sensors 56 can be located on the flexible circuit board in a position that allows them to provide output that accurately indicates the characteristic. For instance, a temperature sensor can be located on the flexible circuit board in a location that such that once the system is assembled, the output of the temperature sensor provides an accurate indication of the temperature of one or more of the power sources. Similarly, a pressure sensor can be located on the flexible circuit board in a location that such that once the system is assembled, the output of the pressure sensor provides an accurate indication of the pressure within one or more of the power sources.

Rather than indicating actual sensors, one or more of the sensors 56 in FIG. 5 can instead represent an electrical contact pad. Each of the electrical contact pads can be connected to an electrical conductor that is in turn connected to a sensor. In this arrangement, a sensor(s) can be moved relative to the flexible circuit board and is accordingly easier to place at a desired location within the power system. For instance, the sensor can be located directly in contact with an electrical power source 12 or even inside of an electrical power source 12.

In instances where one or more of the sensors 56 in FIG. 5 represent an electrical contact pad that is electrically connected to a sensor, only one sensing line 38 need be connected to each of the electrical contact pads rather than the two sensing lines 38 shown in FIG. 5. However, when the sensor requires two or more electrical conductors in order to operate as desired, each of the electrical contact pads can be connected to one of the electrical conductors. As a result, a sensor can be associated with more than one electrical contact pad. For instance, a sensor can be directly connected to more than two electrical conductors and each of the electrical conductors can be connected to a different electrical contact pad.

Suitable electrical conductors for use with electrical contact pads and sensors includes, but is not limited to, wires. A suitable method for attaching a wire to an electrical contact pad includes, but is not limited to, soldering. Alternately, the wire can be connected to the flexible circuit board by the use of a connector such as a plug and socket connector. In these instances, one or more of the sensors 56 in FIG. 5 represents the connector.

The electronics includes a power connector 62 form which the electrical power generated by the power pack 32 can be accessed. For instance, an application that is to be powered by the power pack 32 can be connected to the power connector 62. The accessed power can then be used to power applications such as military, automotive, industrial, aeronautical, and biomedical fields. Particular example applications include, but are not limited to, radio transmissions and night vision devices. Additionally or alternately, electrical energy from outside of the power system can be applied to the power connector 62 so as to re-charge the power pack. Suitable power connectors 62, include, but are not limited to, plug and socket connectors and hybrid plug and socket connectors.

The flexible circuit board can also include other circuits and the circuit lines and the circuit components that enable the functions of these circuits. As an example of other circuits, the electronics can also include control electronics for controlling the charge and/or discharge of the power pack 32. FIG. 5 illustrates control electronics included on the flexible circuit board. For instance, a portion of the conductors on the substrate are control lines 64 that provide electrical communication between different components in the control electronics, or between these components and the power pack 32, or between these components and the controller 54. The components are used to control the charge and/or discharge of the power pack 32. For instance, in some instances, a control components or a combination of control components alters at least one characteristic selected from a group consisting of the voltage of the electrical power that is available from the power sources at the power connector 62, the level of the maximum electrical current that is available from the power sources at the power connector 62, the level of the minimum electrical current that is available from the power sources at the power connector 62 from the power sources, the amount of noise in the electrical signal provided by the power sources at the power connector 62, the level of resistance between the power sources and the power connector 62, and the level of power provided by the power sources at the power connector 62. A control component can be passive in that it is not controlled by the controller 54 or active in that it is controlled by the controller 54.

An example of a component included in the control electronics is the switch 58 shown in FIG. 5. For instance, FIG. 5 shows the control electronics 60 including a switch 58 positioned along one of the power lines 40 such that opening and closing of the switch connects and disconnects the power pack 32 from the power connector 62. The switch 58 is operated by the controller 54. Accordingly, the controller 54 can use the switch 58 to stop and start the charge and/or discharge of the power pack. A suitable switch 58 includes, but is not limited to, a relay, MOSFET, IGBT, and fuse.

Other examples of components that can be included in the control electronics include, but are not limited to, transistors, diodes, operational amplifiers, switches, resistors, inductors, and capacitors.

The control electronics can also include shunt circuits that the controller 54 can use to bypass particular parallel groups. The shunt circuits are each connected in parallel with a parallel group. A shunt circuit includes control lines 64 that provide electrical connections between components such as one or more switches 66 and one or more resistors 64. For instance, the power pack of FIG. 5 includes shunt circuits that are each configured to provide a current pathway around a parallel group. Each shunt circuit includes control lines 64 that connect a switch 66 in series with one or more resistors 64. The control lines 64 are arranged such that one of the parallel groups is bypassed when the switch is closed but the shunt circuit is an open circuit when the switch is open. Accordingly, the parallel group is not shunted when switch 66 is open. When a switch 66 is closed, the associated resistor 68 is selected to prevent the functioning batteries in the bypassed parallel group from being short-circuited.

Although the control lines 64 connecting the switches 66 to the controller 54 are not entirely shown in FIG. 5, the switches 66 can be opened and closed by the controller 54. Accordingly, the controller 54 can cause one or more of the parallel group to be bypassed during the charge and/or discharge of the power pack 32.

Suitable switches 66 include, but are not limited to, relays, MOSFET, IGBT, and fuse.

The control electronics 60 can also include control lines 64 and components that are not controlled by the controller 54. For instance, in some instances, the control electronics includes a voltage regulator (not shown) for regulating the voltage of the electrical energy output from the power pack 32 during the discharge of the power pack 32. Additionally or alternately, the voltage regulator can regulate the voltage of the electrical energy applied to the power pack 32 during the charge of the power pack 32. The voltage regulator need not be controlled by the controller. Alternately, the voltage controller can be controlled by the controller 54.

Other examples of lines and components that can be included in the control electronics are disclosed in U.S. patent application Ser. No. 11/404,211, filed on Apr. 13, 2006, and entitled "Power pack System," and U.S. patent application Ser. No. 11/985,391, filed on Nov. 15, 2007, and entitled "Power Pack," and U.S. patent application Ser. No. 12/587,778, filed on Oct. 13, 2009, and entitled "Balancing of Cells in Cell System," and in U.S. patent application Ser. No. 12/462,070, filed on Jul. 28, 2009, and entitled "Battery System Configured To Survive Failure of One or More Batteries," and in U.S. patent application Ser. No. 11/824, 816, filed on Jul. 3, 2007, entitled "Power pack System" and issued as U.S. Pat. No. 7,843,169 on Nov. 30, 2010, and in U.S. patent application Ser. No. 11/603,757, filed on Nov. 22, 2006, and entitled "System Having Electronics for Dropping Current of Power pack, each of which is incorporated herein in its entirety. The various components that are disclosed in these applications in addition to the power sources, interconnects, processors, and controllers can be included in the control electronics. For instance, the shunt circuits disclosed in U.S. patent application Ser. No. 11/404, 211 can be included in the electronics. As another example, the balancing circuit balancing circuit disclosed in U.S. patent application Ser. No. 11/985,391 can be included in the control electronics. As another example, the balancing terminals from U.S. patent application Ser. No. 12/587,778 can be included in the control electronics. Further, the controller can provide the functionality described in these applications. For instance, the controller can operate the control electronics so the power packs will stay operational despite the failure of one or more power sources as described in U.S. patent application Ser. No. 12/462,070 or can operate the control electronics as described in U.S. patent application Ser. No. 11/824,816 and/or in U.S. patent application Ser. No. 11/603,757.

A portion of the conductors on the substrate can be data lines 70 that carry data generated by the controller 54. For instance, FIG. 5 shows data lines 70 that connect the controller 54 to a data connector 72. The data connector 72 is configured to be coupled with a device that receives data from the power system and/or that provides data to the power system. For instance, the data connector 72 can be connected to a computer that monitors the performance of the power system. As a result, the controller can output data such state of charge, state of health, run time to empty, voltage, current, and temperature to the computer. The data can be output continually, periodically, or in response to an inquiry from the device. Suitable data connectors, include, but are not limited to, plug and socket connectors and hybrid plug and socket connectors.

The device can also provide data to the controller 54. For instance, the device can request that the controller 54 open or close a particular switch 66 or switch 58. Additionally, or alternately, the device can request that the controller transfer energy from one power source to another, or limit the available power from the power sources.

Since the data lines are employed to send and/or receive data, the data lines can carry signals that contain digitally encoded data. For instance, the data lines can carry data encoded according to communication protocols such as RS-232 or CAN. In contrast, the sensor lines carry signals that have an amplitude or other feature that related to the value of the characteristic measured by the sensor. For instance, the amplitude of the signal carried by a light sensor can be proportional to the value of the characteristic measured by the sensor.

The controller operates the control electronics in response to input from the data connector 72 and/or the one or more sensor lines. For instance, the controller can close the switch 66 associated with a particular parallel group if the controller 54 determines that the one or more of the parallel groups has short circuited, has a voltage that is above a threshold, or has a voltage below a threshold. As another example, the controller can open the switch 58 in response to a device connected to the data connector 72 requesting that the power system be taken off line or can close the switch 58 in response to a device connected to the data connector 72 requesting that the power system be put on line.

The various circuit lines such as the control lines 64, data lines, sensing lines 38, and any other circuit lines can be formed on the line layer. The various components of the controller, control electronics, sensors, and any other circuitry included on the flexible circuit board can be surface mounted on the line layer. For instance, the line layer can include solder pads. The solder pads are aligned with openings in the other layers so they can be accessed from above and/or below the flexible circuit board. As a result, the components can be directly soldered to these pads. Another alternative for mounting components on the flexible circuit board is the use of through-holes that extend through all of the layers of the flexible circuit board. Using traditional flexible circuit board fabrication techniques, additional layers can be added to the flexible circuit board to provide one or more power planes and/or one or more ground planes as needed. As a result, since certain components can be directly grounded to a ground plane, these components may be operated by a single line rather than the two lines as illustrated above. For instance, a relay that serves as switch 58 can be directly grounded to a ground plane, and a single control line 64 can connect that switch 58 to the controller.

Rather than having the narrow bridge section 22, the bridge section 22 can be broadened out and at least one part selected from the group consisting of the control electronics 60, components for the control electronics 66, controller 54, power connector 62, data connector 72, sensor 56, and electrical contact pads connected to sensors can be positioned on the bridge section 22. Alternately, all of the portion of these parts can be located on the first section 20 and/or the second section of the flexible circuit board.

Although the systems disclosed above includes one or two power packs, the system can include more than one power pack. Although the power packs disclosed above include multiple parallel groups and series groups, a power pack included in the system can include one or more parallel groups and/or one or more series groups.

Although the power sources 12 such as batteries are each shown above as having a conventional case structure, other case structures can be employed. For instance, batteries with soft or hard case structures can be employed. Additionally, batteries with deformable cases such as the pouches of pouch cells can be employed with the substrate.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:

1. A system, comprising:
multiple electrical power sources;
an electrically insulating substrate physically attached to a terminal on each of the power sources; and
electrical conductors that each has a length, the length of each electrical conductor being immobilized relative to the substrate,
the electrical conductors including interconnect lines and sensing lines,
the interconnect lines providing direct electrical communication between the power sources,
at least one sensing line carrying an electrical signal indicating a voltage across one or more of the power sources; and
electronics immobilized on the substrate and employing the electrical signal to monitor the voltage across the one or more power sources.

2. The system of claim 1, wherein each of the power sources includes an electrochemical cell.

3. The system of claim 1, wherein each of the power sources includes a source selected from a group consisting of capacitors, solar cells/panels and piezoelectric transducers.

4. The system of claim 1, wherein the terminal of each power source is positioned on a different side of the power source from a second terminal, and
the substrate being physically attached to both the first terminal and the second terminal for each of the power sources.

5. The system of claim 4, further comprising:
a holder that holds the power sources, the substrate being connected to the power sources such that a first portion of the substrate is located over a top side of the holder, and
the substrate also being connected to the power sources such that a second portion of the substrate is located under a bottom side of the holder.

6. The system of claim 5, wherein a bridge portion of the substrate connects the first portion of the substrate and the second portion of the substrate, the bridge portion being positioned adjacent to a lateral side of the holder.

7. The system of claim 1, wherein at least one of the sensing lines carries an electrical signal indicating a temperature of one or more of the power sources.

8. The system of claim 1, wherein the interconnect lines connect the power sources in multiple series groups, each series group including multiple power sources connected in series,
the electrical interconnects also connecting the power sources in parallel groups, each parallel group including multiple power sources connected in parallel,
each parallel group including one of the power sources from each of the series groups and each series group including one of the power sources from each one of the parallel groups, and
the electronics using the sensing lines to determine a voltage across each one of the parallel groups.

9. The system of claim 1, wherein at least a portion of the interconnect lines are each welded directly to a terminal on one of the power sources.

10. The system of claim 1, wherein the interconnects include one or more series interconnects that each connects a first selection of the power sources in series with a second selection of the power sources,
the first selection of the power sources including one or more of the power sources and the second selection of the power sources including one or more of the power sources without any of the power sources in the first selection of power sources being included in the second selection of power sources.

11. The system of claim 10, wherein the one or more series interconnects are each in electrical communication with a connector mounted on the substrate.

12. The system of claim 11, wherein the connector is connected to a second connector mounted on a rigid printed circuit board.

13. The system of claim 12, wherein the rigid printed circuit board includes electronics for monitoring the voltage of the first selection of the power sources and the second selection of the power sources.

14. The system of claim 1, wherein the substrate is the substrate of a flexible circuit board.

15. The system of claim 1, wherein the electrical conductors include power lines, the power lines configured to carry electrical power from the power sources to an application powered by the electrical power.

16. The system of claim 1, wherein the electrical conductors include data lines, the data lines carrying digitally encoded electrical signals.

17. The system of claim 1, wherein the electrical conductors include control lines, the control lines providing electrical communication to and/or from a component configured to control charge and/or discharge of the electrical power sources.

18. The system of claim 1, wherein the substrate is a single and continuous material having multiple layers of material immobilized relative to one another.

19. The system of claim 1, wherein the electrical conductors include connection points that are each connected to one of the power sources, and the electrical conductors include openings that each extends through one of the electrical conductors at one of the connection points.

20. The system of claim 19, wherein the electrical conductors include a top side and a bottom side and the substrate is arranged such that the bottom side of the electrical conductors is between the top side of the electrical conductors and the power sources, and the substrate does not cover the top side of the electrical conductors at the contact points.

\* \* \* \* \*